United States Patent [19]

Kitagawa et al.

[11] 4,028,620

[45] June 7, 1977

[54] ELECTRICAL WIRING SYSTEM FOR SELECTIVELY ACTUATING ELECTRICAL LOADS

[75] Inventors: Junji Kitagawa; Sigeyuki Akita, both of Okazaki, Japan

[73] Assignee: Nippon Soken, Inc., Nishio, Japan

[22] Filed: Oct. 9, 1975

[21] Appl. No.: 621,233

[30] Foreign Application Priority Data

Nov. 26, 1974 Japan .......................... 49-136935

[52] U.S. Cl. ............................. 324/51; 307/10 R; 307/38; 323/94 R; 340/172

[51] Int. Cl.² .................... G01R 31/02; H02J 1/00; H04Q 1/08

[58] Field of Search ................ 324/51, 66; 340/52, 340/169, 172; 323/19, 80, 79, 81, 94 R; 307/10 R, 38, 39, 40

[56] References Cited

UNITED STATES PATENTS

| | | | |
|---|---|---|---|
| 2,822,519 | 2/1958 | Murphy | 324/66 |
| 3,054,949 | 9/1962 | Bates et al. | 324/66 |
| 3,182,253 | 5/1965 | Dorsch et al. | 324/66 X |
| 3,691,452 | 9/1972 | Aguiar | 323/19 |
| 3,699,438 | 10/1972 | Webb | 324/66 |
| 3,867,692 | 2/1975 | Esch | 324/66 |

*Primary Examiner*—Gerard R. Strecker
*Attorney, Agent, or Firm*—Cushman, Darby & Cushman

[57] ABSTRACT

An electrical wiring system comprising an instruction unit including a switch mechanism having a plurality of contacts and an output unit connected to the instruction unit through a supply line and a signal line for generating a driving output corresponding to closed one of the contacts in the instruction unit. The instruction unit generates and sends to the output unit through the signal line a voltage signal corresponding to the closed one of the plurality of contacts, and the output unit identifies the closed contact according to the voltage signal received through the signal line and generates an output signal at one of its plurality of output terminals corresponding to the closed contact.

8 Claims, 2 Drawing Figures

ELECTRICAL WIRING SYSTEM FOR SELECTIVELY ACTUATING ELECTRICAL LOADS

BACKGROUND OF THE INVENTION

The present invention relates to an electrical wiring system which may for example be used on an automotive vehicle in connecting a plurality of electrical components to an instruction switch which operates the former through a single supply line and a single signal line.

The conventional electrical wiring systems used on automobiles require as many wires as these are individual loads or electrical component units to accomplish the transmission of power between these electrical units and a group of instruction switches and the use of a large number of wires increases the volume of the wires making the wiring of the automobile difficult. Another disadvantage is an increased probability of causing short-circuits between the vehicle body and the wires.

SUMMARY OF THE INVENTION

With a view to overcoming the foregoing difficulty, it is an object of the present invention to provide an electrical wiring system wherein the transmission of driving instruction signals from an instruction unit to a plurality of loads associated therewith is effected by a voltage dividing method, whereby the transmission of signals is accomplished with a single supply line and a single signal line and the wiring work is also simplified.

In accordance with the present invention, there is thus provided an electrical wiring system comprising an instruction unit including a switch mechanism having a plurality of contacts and an output unit for applying, in accordance with the instruction signal received from the instruction unit, an output to one of a plurality of loads corresponding to the closed one of the contacts, whereby the instruction unit generates and sends to the output unit a voltage signal having a magnitude varying depending on the contact closed, and the output unit in turn identifies the closed contact according to the magnitude of the received voltage signal and generates an output signal at one of its output terminals corresponding to the closed contact.

Therefore, the system of this invention has among its great advantages the fact that only a single signal line is required for transmitting the output voltages of the instruction unit to the output unit and a plurality of loads can be selectively actuated by the instruction unit through the signal line, thus simplifying the design of wiring for transmitting signals to a plurality of loads and the required wiring work and making the system of this invention particularly useful as a means of wiring automobiles or the like where a complicate wiring work is demanded in a limited space.

DESCRIPTION OF THE PREFERRED EMBODIMENT

The present invention will now be described in greater detail with reference to the illustrated embodiment.

Figure 1:
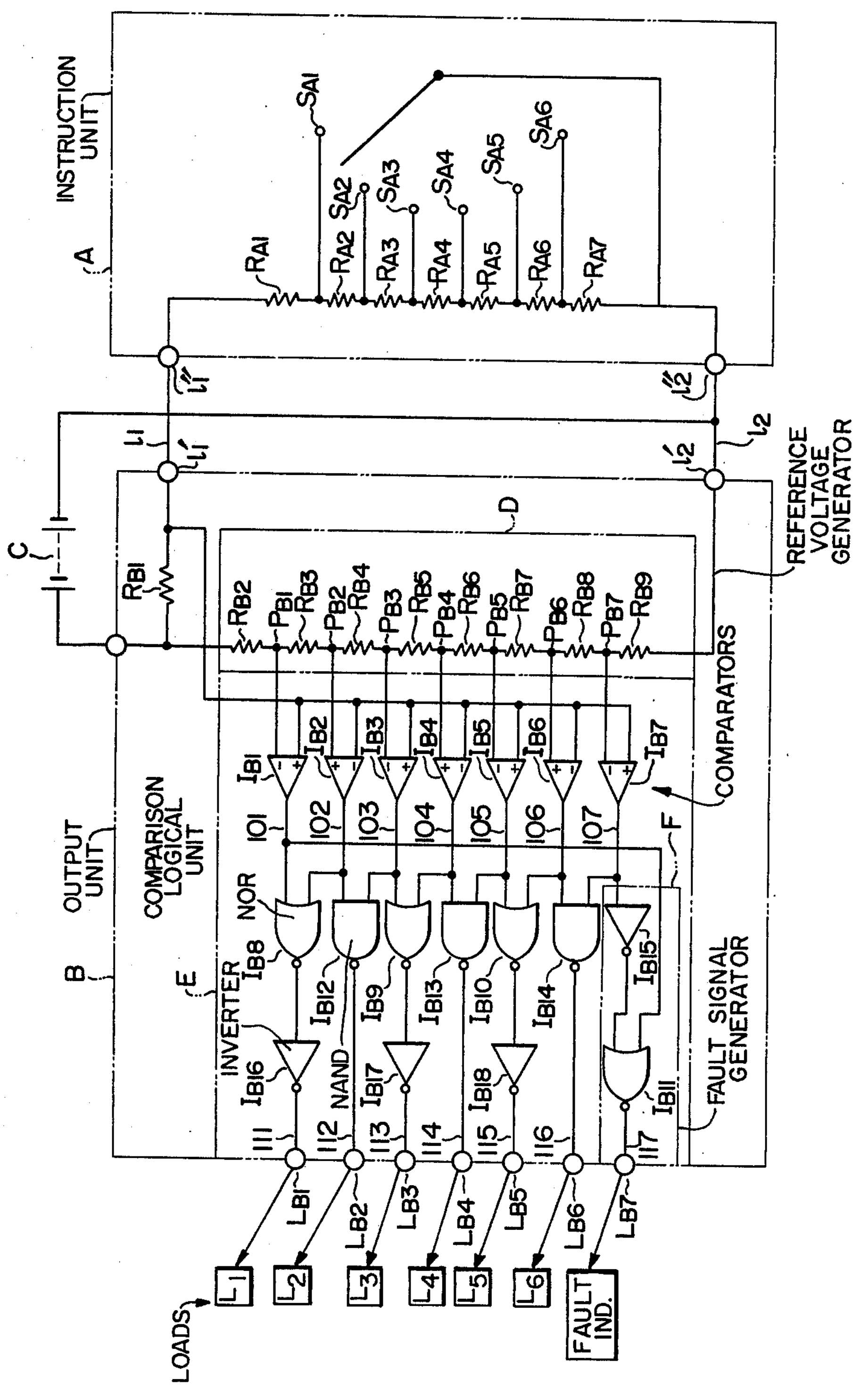
FIG. 1 is a wiring diagram showing an embodiment of an electrical wiring system according to this invention.

Referring first to the wiring diagram of FIG. 1 showing the general construction of the system of this invention, symbol A designates an instruction unit comprising a normally open switch SW having an arm SA for selectively closing any one of a plurality of contacts $S_{A1}$ to $S_{A6}$ and resistors $R_{A1}$ to $R_{A7}$, B an output unit comprising resistors $R_{B2}$ to $R_{B9}$ constituting reference voltage generating means D, comparators $I_{B1}$ to $I_{B7}$, NAND gates $I_{B12}$ to $I_{B14}$, NOR gates $I_{B8}$ to $I_{B11}$ and inverter gates $I_{B15}$ to $I_{B18}$ constituting comparison logical means E and a resistor $R_{B1}$. The instruction unit A and the output unit B are interconnected through a supply line $l_2$ connected to a battery C and a signal line $l_1$.

In the output unit B, symbols $L_{B1}$ to $L_{B6}$ designate output terminals for respectively actuating a plurality of electrical components respectively corresponding to the contacts $S_{A1}$ to $S_{A6}$ in the instruction unit A, F a fault signal generating means that will be described later, $L_{B7}$ an output terminal for fault signals.

With the construction described above, the operation of the system of this invention will now be described with reference to the voltage waveform diagram of FIG. 2.

Figure 2:
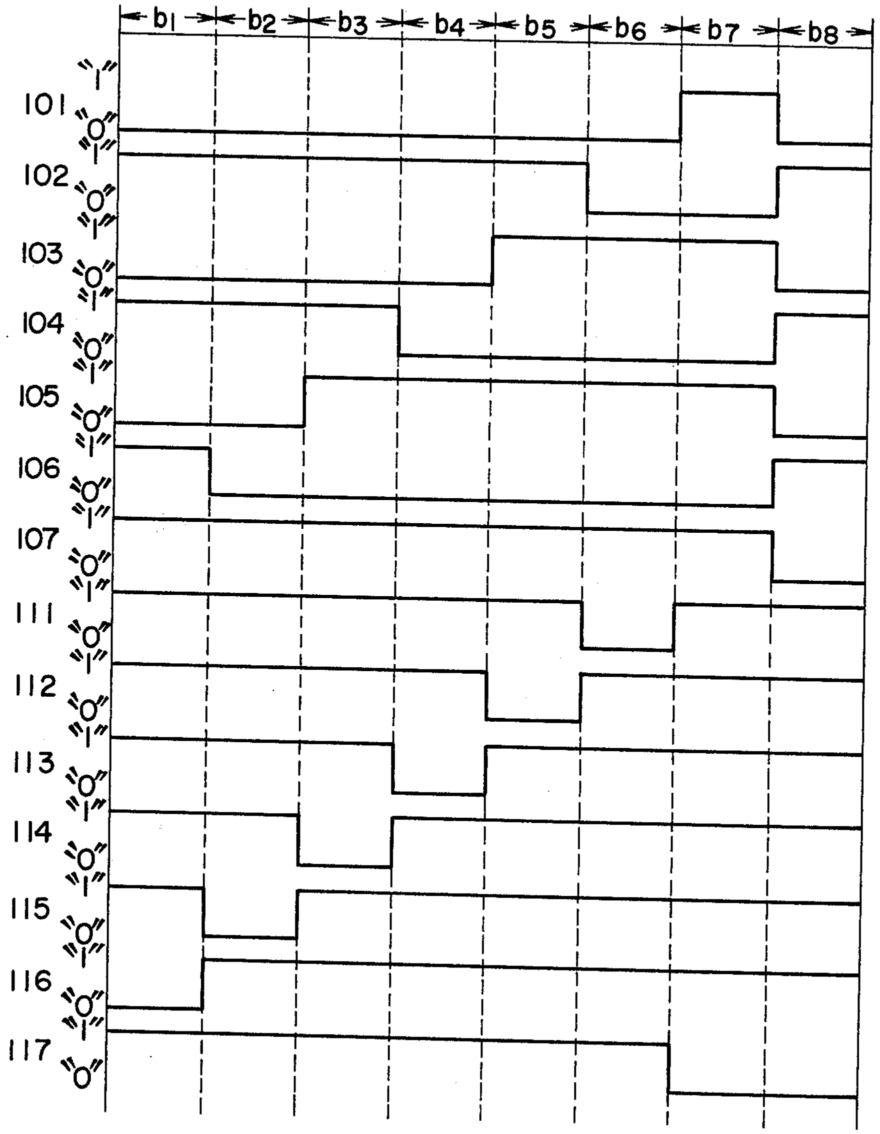
FIG. 2 is a diagram showing the voltage waveforms generated at various points in the system of FIG. 1.

In FIG. 2, the voltage waveforms shown in intervals $b_1$ to $b_6$, respectively, are obtained when the contacts $S_{A1}$ to $S_{A6}$ are respectively closed by switch arm SA in the instruction unit A shown in FIG. 1. Selection of one of those contacts by arm SA selects the corresponding one of the output terminals $L_{B1}$ to $L_{B6}$ to be appropriately energized to actuate the respective load $L_1$ to $L_6$. Numerals 101 through 107 respectively designate the output signals for the comparators $I_{B1}$ through $I_{B7}$ in the output unit B of FIG. 1.

When the contact $S_{A1}$ is closed in the instruction unit A of FIG. 1, the potential at a terminal $l'_1$ of the output unit B becomes higher than the potential at a point $P_{B7}$ but lower than the potential at a point $P_{B6}$ in the output unit B and consequently the output signals of the comparators $I_{B1}$ to $I_{B7}$ in the output unit B become as shown in the interval $b_1$ of FIG. 2. The output signals 101 and 102 are applied too the NOR gate $I_{B8}$ of the output unit B so that the output signal of the NOR gate $I_{B8}$ goes to a "0" level and is inverted by the inverter gate $I_{B16}$ of the output unit B thus causing it to go to a "1" level as shown at the output signal 111 in the interval $b_1$ of FIG. 2.

On the other hand, the output signals 102 and 103 shown in FIG. 2 are applied to the NAND gate $I_{B12}$ of the output unit B so that the output signal of the NAND gate $I_{B12}$ goes to the "1" level as shown at the output signal 112 in the interval $b_1$ of FIG. 2.

Similarly, the output signal of the inverter gate $I_{B17}$ of the output unit B goes to the "1" level as shown at the output signal 113 in FIG. 2, the output signal of the NAND gate $I_{B13}$ to the "1" level as shown at the output signal 114 in FIG. 2, the output signal of the inverter gate $I_{B18}$ to the 1 level as shown at the output signal 115 in FIG. 2 and the output signal of the NAND gate $I_{B14}$ to the "0" level as shown at the output signal 116 in FIG. 2, and a "0" level signal is generated only at the output terminal $L_{B6}$ of the output unit B.

In the like manner, closing the contact $S_{A2}$ in the instruction unit A causes the output signal 115 in FIG. 2 to go to the "0" level only in the interval $B_2$ of FIG. 2, closing the contact $S_{A3}$ in the instruction unit A causes output signal 114 in FIG. 2 to go to the "0" level only in the interval $b_3$ of FIG. 2, closing the contact $S_{A4}$ causes the output signal 113 in FIG. 2 to go to the "0"

level only in the interval $b_4$ of FIG. 2, closing the contact $S_{A5}$ causes the output signal 112 in FIG. 2 to go to the "0" level only in the interval $b_5$ of FIG. 2 and closing the contact $S_{A6}$ causes the output signal 111 in FIG. 2 to go to the "0" level only in the interval $b_6$ of FIG. 2.

In this way, by selectively closing the contacts $S_{A1}$ through $S_{A6}$ to cause respectively unique voltage signals on line $l_1$ of the instruction unit A of FIG. 1, a "O" level signal can be selectively generated at the output terminals $L_{B1}$ through $L_{B6}$ of the output unit B of FIG. 1 to thereby actuate a transistor, relay or the like, and thus a plurality of electrical components operatively associated respectively with the contacts $S_{A1}$ through $S_{A6}$ of the instruction unit A may be selectively actuated.

Assume now that there is an irregularity such as breaking or short-circuiting of the signal line $l_1$ in FIG. 1.

Firstly, in the case of a break in the signal line $l_1$, the potential at the terminal $l'_1$ of the output unit B becomes higher than the potential at a point $P_{B1}$ of the output unit B, so that the output signals 101 through 107 of the comparators $I_{B1}$ through $I_{B7}$ in the output unit B become as shown in the interval $b_7$ of FIG. 2 and the logical operations on these signals cause the output signal 117 in FIG. 2 to go to the "0" level only in the interval $b_7$.

On the other hand, when the signal line $l_1$ of FIG. 1 is short-circuited to a vehicle chassis or a ground, the potential at the terminal $l'_1$ of the output unit B of FIG. 1 becomes lower than the potential at the point $P_{B7}$ of the output unit B, so that the output signals of the comparators $I_{B1}$ through $I_{B7}$ in the output unit B become as shown in the interval $b_8$ of FIG. 2 and the logical operations on these signals cause the output signal 117 in FIG. 2 to go to the "O" level only in the interval $b_8$.

In this way, when the signal line $l_1$ is broken or short-circuited to a vehicle chassis, a "O" level signal is generated at the output terminal $L_{B7}$ of the output unit B in FIG. 1 and the presence of the faulty condition can be indicated by a lamp or the like in response to this "O" level signal.

The illustrated embodiment is also designed so that when all the contacts $S_{A1}$ through $S_{A6}$ are open in the instruction unit A, it is an indication that there exists an irregularity and this results in the same condition as the above-mentioned case where there was a break in the signal line $l_1$.

While, in the illustrated embodiment, the instruction unit A employs the normally open switch having the contacts $S_{A1}$ through $S_{A6}$, the switch may be replaced with a normally closed one.

Furthermore, while the supply line $l_2$ is the ground wire of the battery C, it may be replaced with the positive supply line.

Still, furthermore, the resistors $R_{A1}$ through $R_{A7}$ in the instruction unit A may be replaced with diodes and the resistors $R_{B3}$ through $R_{B8}$ may also be replaced with diodes.

What is claimed is:

1. An electrical wiring system for selectively actuating a plurality of electrical loads comprising:
a direct current power source;
load selection instruction means connected across said direct current power source for generating a direct current voltage having a magnitude varying depending on which one of said plurality of loads the instruction means instructs to be selected;
a single signal line connected to an input of said instruction means for transmitting the voltage signal generated from said instruction means; and
output means connected across said direct current power source and to the other end of said signal line, for generating an output signal at one of a plurality of output terminals thereof corresponding to the magnitude of the voltage signal transmitted through said signal line, each of said output terminals being connectable to each of a plurality of electrical loads which are selectively actuated in response to the magnitude of the voltage signal which is transmitted from said instruction means to said output means through said single signal line.

2. A system according to claim 1, further comprising fault signal generating means responsive to the signal voltage produced at said instruction means input when said signal line is disconnected or shorted out for generating an output signal indicating a fault.

3. A system according to claim 1, wherein said instruction means includes a voltage divider for dividing the supply voltage of said power source to generate a plurality of different voltages respectively at a plurality of corresponding points, and said switch means having said plurality of contacts respectively connected to corresponding ones of said divided voltage points, whereby when any one of said contacts is closed a short-circuit is established between said closed contact and a predetermined potential point to vary the voltage dividing ratio of said voltage divider and generate on said signal line a voltage signal having a magnitude corresponding to said closed contact.

4. A system according to claim 1, wherein said output means includes reference voltage generating means for generating a plurality of reference voltage signals, and comparison logical means for comparing a reference voltage signal generated from said reference voltage generating means with a voltage signal generated from said instruction means and detecting which one of said contacts in said instruction means has been closed to thereby generate an output signal at one of said output terminals corresponding to said closed contact.

5. A system according to claim 4, wherein said reference voltage generating means is a voltage divider for dividing the supply voltage of said power source to generate a plurality of different voltages respectively at a plurality of corresponding divided voltage points.

6. An electrical wiring system for selectively actuating electrical loads comprising:
a direct current power source;
a voltage divider for dividing the supply voltage of said power source to generate a plurality of different voltages respectively at a plurality of corresponding divided voltage points;
switch means having a plurality of contacts respectively connected to corresponding ones of said divided voltage points of said voltage divider, wherein in response to the closing of any one of said contacts a short-circuit is established between said closed contact and a predetermined potential point to vary the voltage dividing ratio of said voltage divider for generating at an output terminal of said voltage divider a voltage signal having a magnitude corresponding to said closed contact;

a signal line connected to the output terminal of said voltage divider for transmitting therealong the output voltage signal of said voltage divider;

reference voltage generating means including another voltage divider for dividing the supply voltage of said power source for generating a plurality of different reference voltages respectively at a plurality of corresponding divided voltage points;

comparison logical means for comparing a reference voltage generated from said reference voltage generating means with a voltage signal generated from said instructions means and for discriminating which one of said contacts in said instruction means has been closed to generate an output signal at one of a plurality of output terminals corresponding to said closed contact in said switch means; and fault signal generating means connected to said comparison logical means for detecting breaking and short-circuiting of said signal line and then generating an output signal indicating a fault.

7. An electrical wiring system for selectively actuating a plurality of loads when connected to respective output terminals, comprising:

a plurality of said output terminals, electrical power means, output terminal selection means having a single signal output line and being connected across said power means for selectively applying to said signal line a voltage having an instant magnitude uniquely corresponding to the one of the said output terminals selected by said selection means, and output means connected across said power means and to said signal line for generating on the basis of the instant magnitude of the voltage on said signal line a load actuating output signal at only the one of said output terminals which corresponds to said instant voltage magnitude.

8. A wiring system as in claim 7 wherein said output means comprises a comparison logical circuit having a plurality of comparators for providing respective outputs dependent upon the instant magnitude of said signal line voltage relative to respective reference voltages and OR and NAND function circuit means operative on overlapping successive pairs of said comparator outputs to provide the said load actuating signal at only one of said output terminals as aforesaid.

* * * * *